(12) United States Patent
Kraus et al.

(10) Patent No.: US 11,387,219 B2
(45) Date of Patent: Jul. 12, 2022

(54) POWER SEMICONDUCTOR MODULE WITH POWER SEMICONDUCTOR SWITCHES

(71) Applicant: SEMIKRON ELEKTRONIK GMBH & CO. KG, Nuremberg (DE)

(72) Inventors: Martin Kraus, Nuremberg (DE); Klaus Benkert, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 345 days.

(21) Appl. No.: 16/823,475

(22) Filed: Mar. 19, 2020

(65) Prior Publication Data
US 2020/0343225 A1 Oct. 29, 2020

(30) Foreign Application Priority Data

Apr. 25, 2019 (DE) .................. 10 2019 110 716.4

(51) Int. Cl.
| | |
|---|---|
| *H01L 25/11* | (2006.01) |
| *H01L 25/07* | (2006.01) |
| *H01L 23/50* | (2006.01) |
| *H01L 23/64* | (2006.01) |
| *H01L 25/18* | (2006.01) |
| *H01R 12/71* | (2011.01) |

(52) U.S. Cl.
CPC ............ *H01L 25/071* (2013.01); *H01L 23/50* (2013.01); *H01L 23/642* (2013.01); *H01L 25/18* (2013.01); *H01R 12/714* (2013.01)

(58) Field of Classification Search
CPC ...... H01L 25/071; H01L 23/50; H01L 23/642
See application file for complete search history.

(56) References Cited

U.S. PATENT DOCUMENTS

| 9,413,114 B2* | 8/2016 | Yamkovoy | ........... H01R 13/652 |
| 9,462,695 B2* | 10/2016 | Lemke | ............. H01L 23/49861 |
| 9,462,708 B2* | 10/2016 | Bogen | .................. H05K 7/1432 |
| 10,971,435 B2* | 4/2021 | Mauder | ................... H01L 23/60 |

(Continued)

FOREIGN PATENT DOCUMENTS

| CN | 111863786 A * | 10/2020 | ....... H01L 23/49517 |
| DE | 19519538 A1 * | 11/1996 | ............. H01L 25/16 |

(Continued)

OTHER PUBLICATIONS

DE 10 2019 110 716.4, German Examination Report dated Nov. 12, 2019, 5 pages—German, 2 pages—English.

*Primary Examiner* — Laura M Menz
(74) *Attorney, Agent, or Firm* — Andrew F. Young; Nolte Lackenbach Siegel

(57) ABSTRACT

A power semiconductor module has a first and second intermediate circuit rail, an AC potential rail and with a packaged first and second power semiconductor switch. The respective power semiconductor switch has a first and second load current terminal and a control terminal, wherein the first power semiconductor switch is between the first intermediate circuit rail and the AC potential rail and the second power semiconductor switch is between the second intermediate circuit rail and the AC potential rail. The first load terminal of the first power semiconductor switch is contacted to the first intermediate circuit rail and the second load terminal of the first power semiconductor switch is electrically conductively contacted to the AC potential rail.

13 Claims, 4 Drawing Sheets

(56) References Cited

U.S. PATENT DOCUMENTS

| | | | | |
|---|---|---|---|---|
| 2011/0215400 A1* | 9/2011 | Nakamura | .............. | H01L 27/07 |
| | | | | 257/334 |
| 2015/0041955 A1* | 2/2015 | Zerbe | ...................... | H01L 25/16 |
| | | | | 257/532 |
| 2017/0092562 A1* | 3/2017 | Kato | ........................ | H01L 23/36 |
| 2020/0343225 A1* | 10/2020 | Kraus | .............. | H01L 23/49517 |
| 2022/0134889 A1* | 5/2022 | Fujioka | ................. | B60L 15/007 |
| | | | | 307/10.1 |
| 2022/0139767 A1* | 5/2022 | Lee | ......................... | H01L 25/50 |
| | | | | 257/183 |
| 2022/0139855 A1* | 5/2022 | Hwang | ................. | G11C 16/08 |
| | | | | 257/314 |
| 2022/0139880 A1* | 5/2022 | Lee | ..................... | H01L 25/0652 |
| | | | | 257/621 |

FOREIGN PATENT DOCUMENTS

| | | | | |
|---|---|---|---|---|
| DE | 10 2016 100 617 | | 7/2017 | |
| DE | 102016100617 A1 * | | 7/2017 | ............. H01L 23/04 |
| DE | 102016117248 A1 * | | 3/2018 | ............. H01L 23/48 |
| DE | 102016117248 B4 * | | 7/2019 | ............. H01L 23/48 |
| DE | 102019110716 B3 * | | 1/2020 | ....... H01L 23/49517 |
| EP | 3208925 A1 * | | 8/2017 | ............ H02M 7/003 |
| WO | WO-2010121230 A1 * | | 10/2010 | ........... H01L 23/427 |
| WO | WO-2016006318 A1 * | | 1/2016 | ........... H01L 23/427 |
| WO | WO-2016060123 A1 * | | 4/2016 | ............ H01H 27/00 |
| WO | WO-2017140464 A1 * | | 8/2017 | ............ H02M 7/003 |
| WO | WO-2018119153 A2 * | | 6/2018 | ........... H01Q 1/2283 |

* cited by examiner

POWER SEMICONDUCTOR MODULE WITH POWER SEMICONDUCTOR SWITCHES

CROSS REFERENCE TO RELATED APPLICATIONS

This application relates to, and claims priority from, DE Ser. No.:10 2019 110 716.4 filed Apr. 25, 2019, the entire contents of which are incorporated herein by reference.

FIGURE SELECTED FOR PUBLICATION

FIG. 1.

BACKGROUND OF THE INVENTION

Field of the Invention

The invention relates to a power semiconductor module with power semiconductor switches.

Description of the Related Art

DE 10 2016 100 617 A1 discloses a power semiconductor module with a housing, with a capacitor having a first and a second electrical capacitor terminal, with unpackaged power semiconductor components arranged side-by-side in the housing on a DCB substrate, and with an electrical connection device which is electrically conductively connected to the power semiconductor components and has an electrically conducting first connection device contact surface and an electrically conducting second connection device contact surface, which is electrically insulated from the first connection device contact surface. One housing wall of the housing forms a recess, the capacitor being arranged in the recess. The first capacitor terminal is electrically conductively connected to the first connection device contact surface and the second capacitor terminal is electrically conductively connected to the second connection device contact surface. The power semiconductor module has a low inductance. A disadvantage of this is that the power semiconductor module has a high space requirement.

ASPECTS AND SUMMARY OF THE INVENTION

The object of the invention is to create a low-inductance power semiconductor module which has a small footprint.

This object is achieved by a power semiconductor module having an electrically conducting first intermediate circuit rail for carrying a first DC voltage potential, having an electrically conducting second intermediate circuit rail for carrying a second DC voltage potential, an electrically conducting AC potential rail for carrying an AC voltage potential and having a packaged first and second power semiconductor switch, wherein the respective power semiconductor switch has a first main side and a second main side opposite the first main side, wherein a first load current terminal of the respective power semiconductor switch is arranged on the first main side and a second load current terminal of the respective power semiconductor switch and a control terminal of the respective power semiconductor switch are arranged on the second main side, wherein the first power semiconductor switch is arranged between the first intermediate circuit rail and the AC potential rail, and the second power semiconductor switch is arranged between the second intermediate circuit rail and the AC potential rail, wherein the first load terminal of the first power semiconductor switch is electrically conductively contacted to the first intermediate circuit rail and the second load terminal of the first power semiconductor switch is electrically conductively contacted to the AC potential rail, wherein the first load terminal of the second power semiconductor switch is electrically conductively contacted to the AC potential rail and the second load terminal of the second power semiconductor switch is electrically conductively contacted to the second intermediate circuit rail, wherein the control terminal of the first power semiconductor switch is arranged projecting from the AC potential rail in the direction perpendicular to the normal direction of the AC potential rail, wherein the second intermediate circuit rail has a first through opening aligned flush with the control terminal of the first power semiconductor switch in the normal direction of the AC potential rail, and a second through opening aligned flush in the normal direction of the AC potential rail aligned flush with the control terminal of the second power semiconductor switch.

It has proven to be advantageous if the control terminal of the second power semiconductor switch is arranged projecting from the AC potential rail in the direction perpendicular to the normal direction of the AC potential rail, in the opposite direction to the control terminal of the first power semiconductor switch. This enables a very symmetrical electrical and mechanical design of the power semiconductor module to be achieved.

It also proves advantageous if the power semiconductor module has electrically conducting first contact springs, which each have a first and a second contact device and an elastic spring section arranged between the first and second contact device, wherein a section of a respective first contact spring extends through the first or second through opening, the first contact device of the respective first contact spring resting on a control terminal of the respective power semiconductor switch. This enables a reliable, vibration load-resistant electrical connection of a circuit board to the control terminal of the respective power semiconductor switch.

It also proves advantageous if on the second main side an auxiliary terminal of the respective power semiconductor switch is arranged, which is electrically conductively connected to the first load current connector of the respective power semiconductor switch, wherein the auxiliary terminal of the first power semiconductor switch is arranged projecting from the AC potential rail in the direction perpendicular to the normal direction of the AC potential rail, wherein the second intermediate circuit rail has a third through opening aligned flush with the control terminal of the first power semiconductor switch in the normal direction of the AC potential rail, and a fourth through opening aligned flush in the normal direction of the AC potential rail aligned flush with the control terminal of the second power semiconductor switch. This enables a direct access to the auxiliary terminals of the power semiconductor switches.

In this context it proves advantageous if the control terminal of the second power semiconductor switch is arranged projecting from the AC potential rail in the direction perpendicular to the normal direction of the AC potential rail, in the opposite direction to the control terminal of the first power semiconductor switch. This enables a very symmetrical electrical and mechanical design of the power semiconductor module to be achieved.

In addition, it proves advantageous if the first and third through opening are connected to each other so that they form a first overall opening, and/or that the second and fourth through opening are connected to each other so that they form a second overall opening. This enables a particularly simply designed power semiconductor module to be created.

It additionally proves advantageous if the power semiconductor module has electrically conducting second contact springs, which each have a first and a second contact device and an elastic spring section arranged between the first and second contact device, wherein a section of a respective first contact spring extends through the third or fourth through opening, the first contact device of the respective first contact spring resting on a control terminal of the respective power semiconductor switch. This enables a reliable, vibration load-resistant electrical connection of a circuit board to the auxiliary terminal of the respective power semiconductor switch.

It also proves advantageous if the power semiconductor module has a first capacitor arranged between the first and second intermediate circuit rail, wherein an electrical first terminal of the first capacitor is electrically conductively connected to the first intermediate circuit rail and an electrical second terminal of the first capacitor is electrically conductively connected to the second intermediate circuit rail. The first capacitor is preferably used as a snubber capacitor to reduce electrical voltage and/or current oscillations. Due to the arrangement of the first capacitor between the first and second intermediate circuit rail, the capacitor can particularly effectively reduce any voltage and/or current oscillations that occur.

In addition, it proves advantageous if the power semiconductor module has a second capacitor which is not arranged between the first and second intermediate circuit rail, wherein an electrical first terminal of the second capacitor is electrically conductively connected to the first intermediate circuit rail and an electrical second terminal of the second capacitor is electrically conductively connected to the second intermediate circuit rail. The second capacitor is preferably used as an intermediate circuit capacitor for storing electrical energy. The second capacitor preferably has a higher capacitance than the first capacitor.

In addition, it proves advantageous if the respective load current terminal is electrically conductively contacted to the respective intermediate circuit rail or to the AC potential rail, in each case via a metal layer consisting of an aluminum-nickel metal composite. This achieves a particularly reliable electrical contacting of the load current terminals of the power semiconductor switches to the intermediate circuit rails and to the AC potential rail.

In this context it proves advantageous if the respective metal layer consisting of an aluminum-nickel metal composite is generated as a result of an exothermic thermal reaction of a stack of alternating aluminum and nickel layers arranged on top of one another which have a thickness in the nanometer range. This results in a power semiconductor module which can be particularly efficiently produced.

In addition, a power semiconductor device which has proved advantageous has a power semiconductor module according to the invention and a circuit board, which has conductor tracks on the main side thereof facing the second intermediate circuit rail, wherein the first contact springs are arranged between the circuit board and the second intermediate circuit rail, wherein the respective second contact device of the first contact springs in each case rests on one of the conductor tracks of the circuit board, wherein the circuit board is arranged compressed in the direction of the power semiconductor switches in such a way that the respective second contact device of the first contact springs forms an electrically conducting pressure contact with the conductor track of the circuit board on which it rests, and the first contact devices of the first contact springs form an electrically conducting pressure contact with the control terminals of the power semiconductor switches. This creates a low-inductance power semiconductor device, the circuit board of which is electrically conductively connected to the control terminals of the power semiconductor switches in a vibration load-resistant manner.

In this context it proves advantageous if the second contact springs, if present, are arranged between the circuit board and the second intermediate circuit rail, wherein the respective second contact device of the second contact springs rests on one of the conductor tracks of the circuit board, wherein the circuit board is arranged compressed in the direction of the power semiconductor switches in such a way that the respective second contact device of the second contact springs forms an electrically conducting pressure contact with the conductor track of the circuit board on which it rests, and the first contact devices of the second contact springs form an electrically conducting pressure contact with the auxiliary terminals of the power semiconductor switches. This creates a low-inductance power semiconductor device, the circuit board of which is electrically conductively connected to the auxiliary terminals of the power semi-conductor switches in a vibration load-resistant manner.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
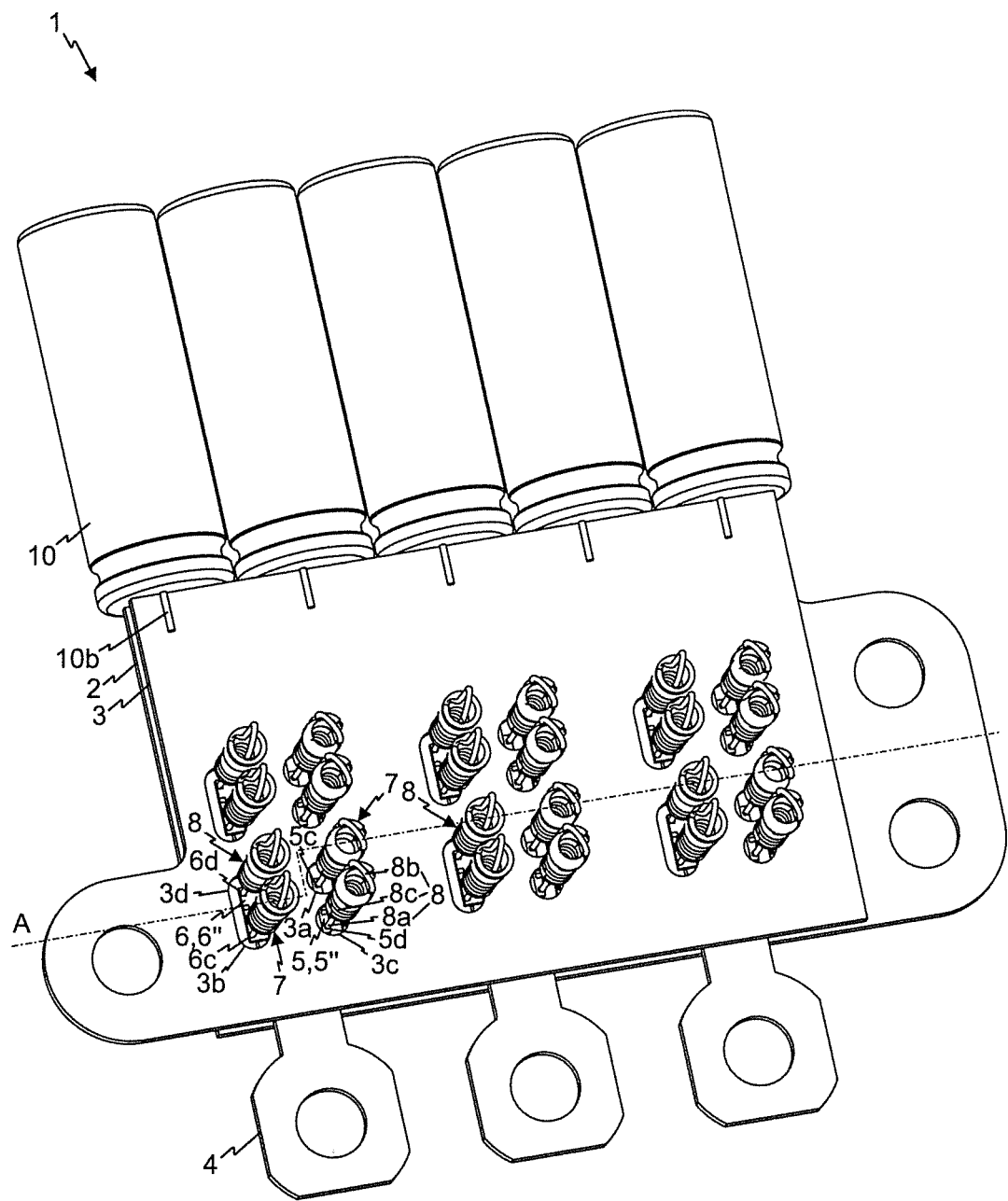
FIG. 1 shows a perspective view of a power semiconductor module according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
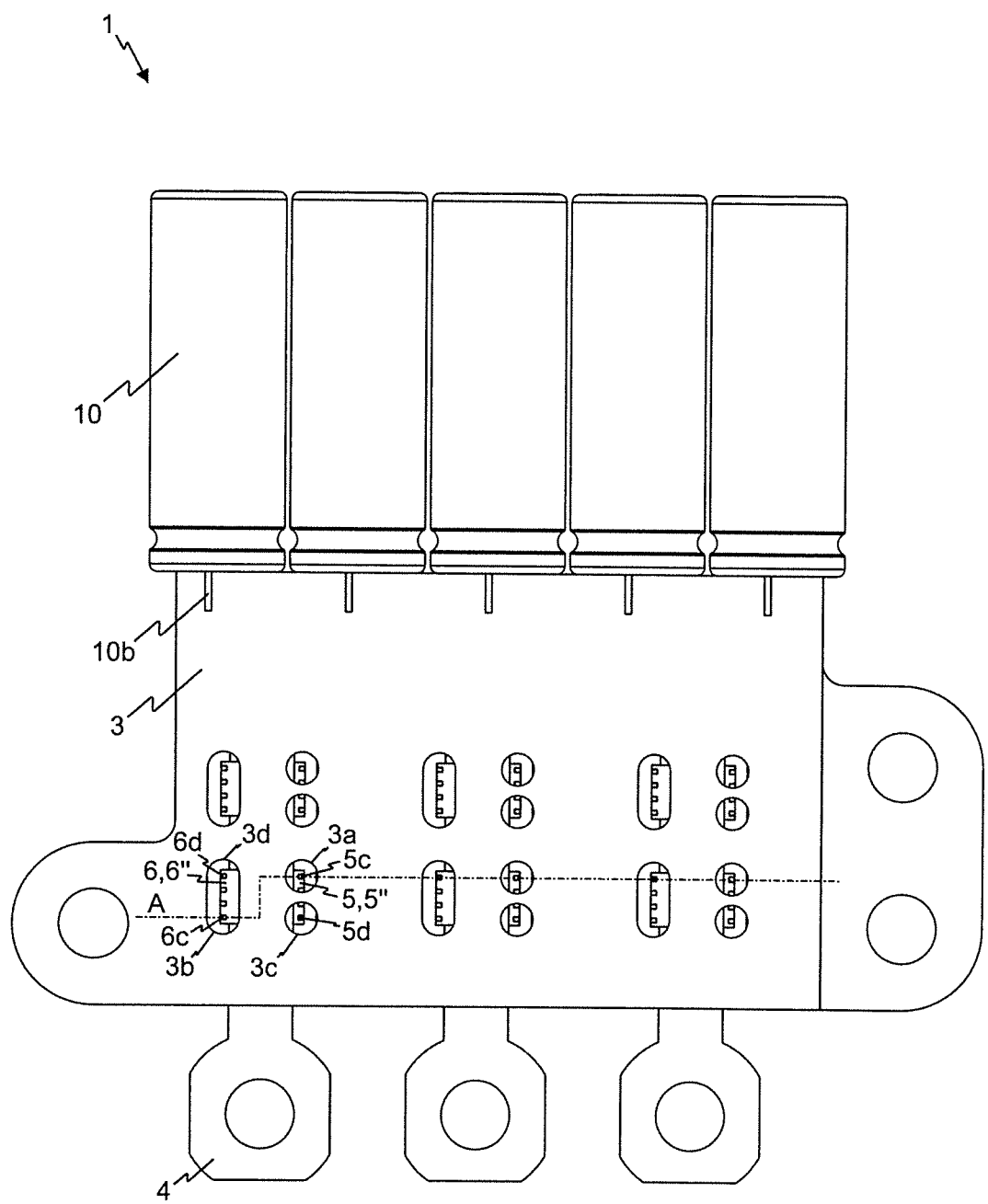
FIG. 2 shows a plan view of the power semiconductor module according to the invention.
Figure 3:
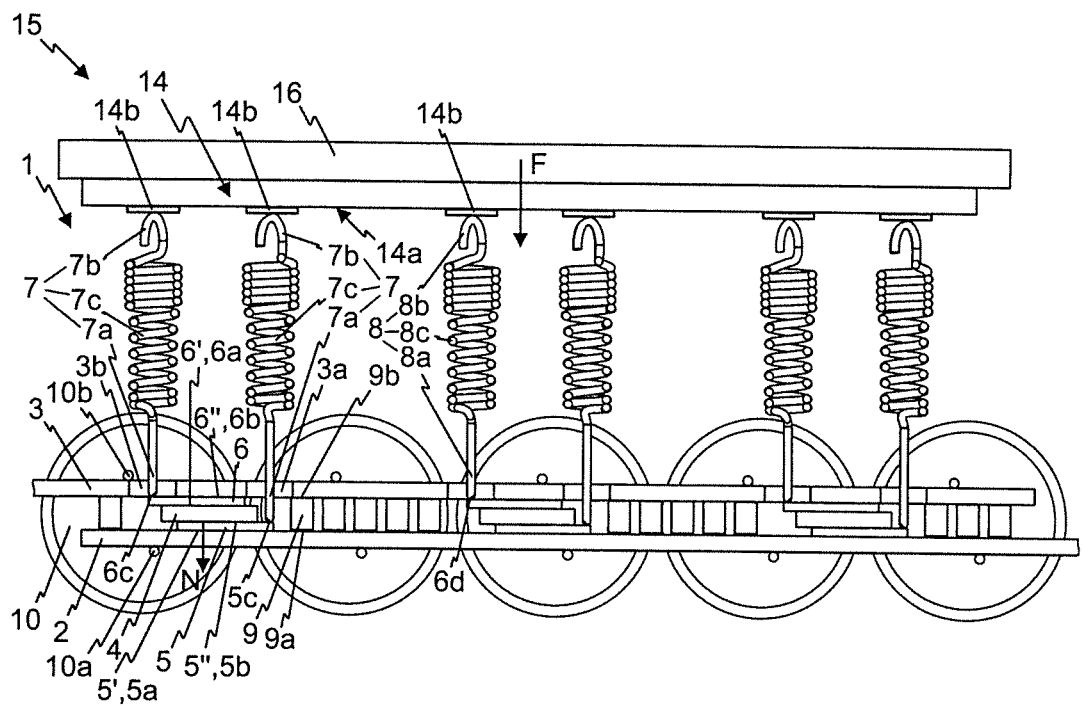
FIG. 3 shows a sectional view of a power semiconductor device with a power semiconductor module according to the invention and with a circuit board.
Figure 4:
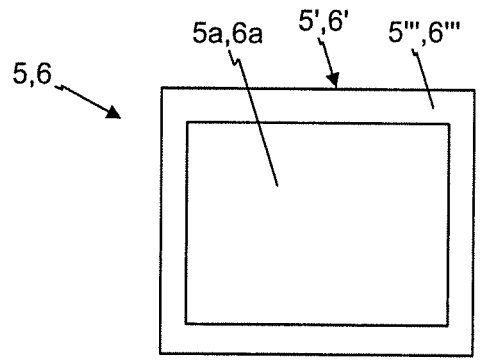
FIG. 4 shows a plan view with respect to FIG. 1 to FIG. 3 from below of a first or second power semiconductor switch of a power semiconductor module according to the invention.
Figure 5:
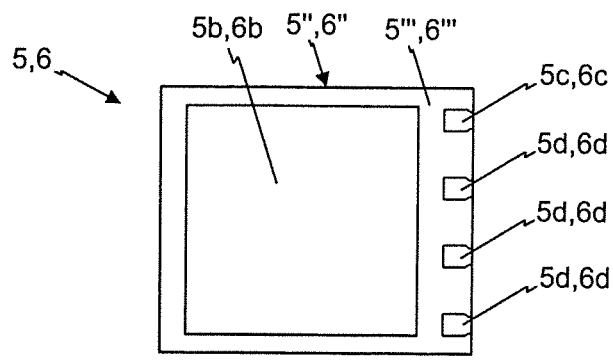
FIG. 5 shows a plan view with respect to FIG. 1 to FIG. 3 from above of the first or second power semiconductor switch of a power semiconductor module according to the invention.

FIG. 1 shows a perspective view of a power semiconductor module 1 according to the invention. FIG. 2 shows a plan view from above of the power semiconductor module 1 according to the invention, wherein for the sake of clarity the contact springs 7 and 8 shown in FIG. 1 are not shown in FIG. 2. FIG. 3 shows a sectional view of a power semiconductor device 15 with the power semiconductor module 1 according to the invention and with a circuit board 14. FIG. 4 shows a plan view with respect to FIG. 1 to FIG. 3 from below, of a first or second power semiconductor switch 5 or 6 of the power semiconductor module 1 according to the invention and FIG. 5 shows a plan view from above of the power semiconductor switches 5 or 6.

The power semiconductor module 1 has an electrically conducting first intermediate circuit rail 2 for carrying a first DC voltage potential, an electrically conducting second intermediate circuit rail 3 for carrying a second DC voltage potential, and an electrically conducting AC potential rail 4 for carrying an AC voltage potential. The intermediate circuit rails 2 and 3 and the AC potential rail 4 are implemented as flat conductors. The intermediate circuit rails 2 and 3 and the AC potential rail 4 are preferably in the form of metal busbars, in particular made of a copper or a copper alloy.

The power semiconductor module 1 has a packaged first power semiconductor switch 5 and a packaged second power semiconductor switch 6. The power semiconductor switches 5 and 6 are implemented as packaged power semiconductor switches, i.e. in contrast to so-called naked chips, as illustrated for example in FIG. 4 and FIG. 5, they have a housing 5''' or 6'''. The respective power semiconductor switch 5 or 6 has a first main side 5' or 6' and a second main side 5'' or 6'' opposite to the first main side 5' or 6', wherein a first load current terminal 5a or 6a is arranged on the first main side 5' or 6' and a second load current terminal 5b or 6b and a control terminal 5c or 6c of the respective power semiconductor switch 5 or 6 is arranged on the second main side 5'' or 6''. The power semiconductor switches 5 and 6 are generally in the form of transistors, such as IGBTs (Insulated Gate Bipolar Transistor) or MOSFETs (Metal Oxide Semiconductor Field Effect Transistor) or in the form of thyristors. In the context of the exemplary embodiment, the power semiconductor switches 5 and 6 are in the form of MOSFETS, wherein the respective first load current terminal 5a or 6a is in the form of the source terminal of the respective power semiconductor switch 5 or 6, the respective second load current terminal 5b or 6b is in the form of the drain terminal of the respective power semiconductor switch 5 or 6 and the respective control terminal 5c or 6c is in the form of the gate terminal of the respective power semiconductor switch 5 or 6.

The first power semiconductor switch 5 is arranged between the first intermediate circuit rail 2 and the AC potential rail 4, and the second power semiconductor switch 6 is arranged between the second intermediate circuit rail 3 and the AC potential rail 4. The first load terminal 5a of the first power semiconductor switch 5 is electrically conductively contacted to the first intermediate circuit rail 2 and the second load terminal 5b of the first power semiconductor switch 5 is electrically conductively contacted to the AC potential rail 4. The first load terminal 6a of second power semiconductor switch 6 is electrically conductively contacted to the AC potential rail 4 and the second load terminal 6b of the second power semiconductor switch 6 is electrically conductively contacted to the second intermediate circuit rail 3.

The power semiconductor switches 5 and 6 are thus electrically interconnected to form a half-bridge circuit 5. In the context of the exemplary embodiment the first DC voltage potential is implemented as a negative DC voltage potential and the second DC voltage potential as a positive DC voltage potential. Discrete, preferably packaged, diodes can be connected in anti-parallel with the power semiconductor switches 5 and 6.

The control terminal 5c of the first power semiconductor switch 5 is arranged projecting from the AC potential rail 4 in the direction perpendicular to the normal direction N of the AC potential rail 4. The normal direction N of the AC potential rail 4 is the normal direction N of the surface of the AC potential rail 4 arranged opposite the second load current terminal 5b of the first power semiconductor switch 5. The second intermediate circuit rail 3 has a first through opening 3a aligned flush with the control terminal 5c of the first power semiconductor switch 5 in the normal direction N of the AC potential rail 4, and a second through opening 3b aligned flush in the normal direction N of the AC potential rail 4 aligned flush with the control terminal 6c of the second power semiconductor switch 6.

Due to the very flat design of the power semiconductor module 1 according to the invention, the module has low inductance and a small footprint. Due to the design of the power semiconductor switches 5 and 6 as packaged components and the feature that the control terminal 5c of the first power semiconductor switch 5 is arranged projecting from the AC potential rail 4 in the direction perpendicular to the normal direction N of the AC potential rail 4, in combination with the first and second through opening 3a and 3b a very flat design of the power semiconductor module is enabled, since in spite of the very flat design of the power semiconductor module a direct electric access to the control terminals 5c and 6c of the power semiconductor switches 5 and 6 is made possible.

The control terminal 6c of the second power semiconductor switch 6 is preferably arranged projecting from the AC potential rail 4 in the direction perpendicular to the normal direction N of the AC potential rail 4, in the opposite direction to the control terminal 5c of the first power semiconductor switch 5. This enables a very symmetrical electrical and mechanical design of the power semiconductor module 1 to be achieved.

The power semiconductor module 1 preferably has electrically conducting first contact springs 7, which each have a first and a second contact device 7a and 7b and an elastic spring section 7c arranged between the first and second contact device 7a and 7b. The spring section 7c is preferably designed as a spiral spring. A section of the respective first contact spring 7 passes through a respective through opening 3a or 3b of the second intermediate circuit rail 3. The first contact device 7a of the respective first contact spring 7 rests on a respective control terminal 5c or 6c of the respective power semiconductor switch 5 or 6.

On the second main side 5" or 6" of the respective power semiconductor switch 5 or 6 an auxiliary terminal 5d or 6d of the respective power semiconductor switch 5 or 6 is preferably arranged, which is electrically conductively connected to the first load current terminal 5a or 6a of the respective power semiconductor switch 5 or 6 inside the housing 5' or 6' of the respective power semiconductor switch 5 or 6. The auxiliary terminal 5d of the respective power semiconductor switch 5 is arranged projecting from the AC potential rail 4 in the direction perpendicular to the normal direction N of the AC potential rail 4. The second intermediate circuit rail 3 preferably has a third through opening 3c aligned flush with the auxiliary terminal 5d of the first power semiconductor switch 5 in the normal direction N of the AC potential rail 4, and a fourth through opening 3d aligned flush with the auxiliary terminal 6d of the second power semiconductor switch 6 in the normal direction N of the AC potential rail 4.

The auxiliary terminal 6d of the second power semiconductor switch 6 is preferably arranged projecting from the AC potential rail 4 in the direction perpendicular to the normal direction N of the AC potential rail 4, in the opposite direction to the auxiliary terminal 5d of the first power semiconductor switch 5.

In addition, the first and third through opening 3a and 3c can be connected to each other so that they form a first overall opening, and/or the second and fourth through opening 3b and 3d can be connected to each other so that they form a second overall opening. In the exemplary embodiment, as illustrated by way of example in FIG. 1 and FIG. 2, the second and fourth through opening 3b and 3d are connected to each other.

The power semiconductor module 1 preferably has electrically conducting second contact springs 8, which each have a first and a second contact device 8a and 8b and an elastic spring section 8c arranged between the first and second contact device 8a and 8b. The spring section 8c is preferably designed as a spiral spring. A section of the respective second contact spring 8 passes through a respective through opening 3c or 3d. The first contact device 8a of the respective second contact spring 8 rests on an auxiliary terminal 5d or 6d of the respective power semiconductor switch 5 or 6.

It should be noted that for guiding and/or holding the contact springs 7 and 8, the power semiconductor module 1 can have a power semiconductor module housing, not shown in the Figures, having opening channels, wherein a section of the contact springs 7 and 8 is movably arranged in the opening channels.

It should further be noted that in the exemplary embodiment as shown in FIG. 4, the respective power semiconductor switch 5 or 6 has three auxiliary terminals 5d or 6d, which are electrically conductively connected to the first load current terminal 5a or 6a of the respective power semiconductor switch 5 or 6 inside the housing 5' or 6' of the respective power semiconductor switch 5 or 6.

The power semiconductor module 1, an example of which is illustrated in FIG. 3, preferably has a first capacitor 9 arranged between the first and second intermediate circuit rail 2 and 3. An electrical first terminal 9a of the first capacitor 9 is electrically conductively connected to the first intermediate circuit rail 2, and an electrical second terminal 9b of the first capacitor 9 is electrically conductively connected to the second intermediate circuit rail 3, e.g. by means of a soldered connection. The first capacitor 9 is preferably used as a snubber capacitor to reduce electrical voltage and/or current oscillations. The power semiconductor module 1 preferably has a plurality of first capacitors 9.

The power semiconductor module 1 can have a second capacitor 10, which is preferably not arranged between the first and second intermediate circuit rail 2 and 3. An electrical first terminal 10a of the second capacitor 10 is electrically conductively connected to the first intermediate circuit rail 2, and an electrical second terminal 10b of the second capacitor 2 is electrically conductively connected to the second intermediate circuit rail 3, e.g. by means of a soldered or welded connection. The second capacitor 10 preferably acts as an intermediate circuit capacitor for storing electrical energy. The first and second intermediate circuit rails 2 and 3 together with the second capacitor 10 form a DC intermediate circuit. The power semiconductor module 1 can have a plurality of second capacitors 10.

Figure 6:
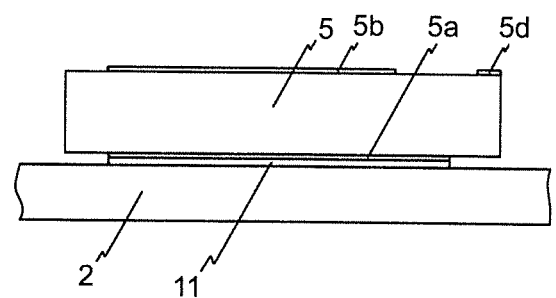
FIG. 6 shows a first power semiconductor switch of a power semiconductor module according to the invention and a first intermediate circuit rail of the power semiconductor module according to the invention, which are electrically conductively contacted to each other via a metal layer.
Figure 7:
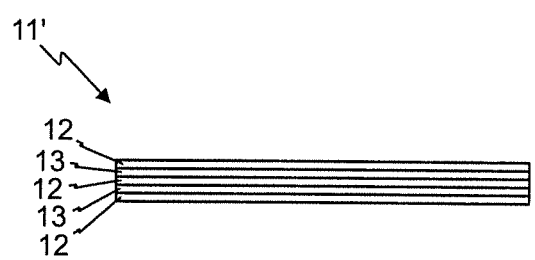
FIG. 7 shows a stack of nanometer-thick aluminum and nickel layers arranged alternately on top of one another.

The respective load current terminal 5a, 5b, 6a or 6b is electrically conductively contacted to the respective intermediate circuit rail 2 or 3 or to the AC potential rail 4, in each case via a metal layer 11 consisting of an aluminum-nickel metal composite. FIG. 6 shows an example of this in the form of a detail view of the first load current terminal 5a of the first power semiconductor switch 5 and the first intermediate circuit rail 2, which are electrically conductively contacted with each other via the metal layer 11 made of an aluminium-nickel metal composite. The remaining load current terminals 5b, 6a and 6b of the power semiconductor switches 5 and 6 are electrically conductively contacted, in a similar way to that shown in FIG. 6, to the second intermediate circuit rail 3 or to the AC potential rail 4. The respective metal layer 11 consisting of an aluminium-nickel metal composite is preferably generated as a result of an exothermic thermal reaction of a stack 11' of alternating aluminum and nickel layers 12 and 13 arranged on top of one another, which have a thickness in the nanometer range (see FIG. 7). To form the metal layer 11 consisting of an aluminium-nickel metal composite, the stack 11' is arranged between the two elements to be connected, here between the first load current terminal 5a of the first power semiconductor switch 5 and the first intermediate circuit rail 2, and then an electrical voltage is applied to the stack 11', causing an exothermic thermal reaction to occur in the stack 11', which transforms the stack 11' into the metal layer 11 consisting of the aluminium-nickel metal composite. The application of the electrical voltage to the stack 11' is preferably carried out by applying an electrical voltage between the second load current terminal 5b of the first power semiconductor switch 5 and the first intermediate circuit rail 2 in the forward direction of the first power semiconductor switch 5, and then turning on the first power semiconductor switch 5. The remaining electrically conductive contacts of the load current terminals 5b, 6a and 6b to the second intermediate circuit rail 3 or to the AC potential rail 4 are preferably produced in an analogous way. Of course, the electrically conductive contacting of the respective load current connector 5a, 5b, 6a or 6b to the respective intermediate circuit rail 2 or 3 or to the AC potential rail 4 can also be implemented, e.g., in the form of a soldered or sintered contact. It should be noted that for the sake of clarity the respective metal layer 11 is not shown in FIG. 3.

The power semiconductor device 15 has a power semiconductor module 1 according to the invention and a circuit board 14, which has conductor tracks 14b on the second main side 14a thereof facing the intermediate circuit rail 3. The first contact springs 7 are arranged between the circuit board 14 and the second intermediate circuit rail 3. The second contact device 7b of the first contact springs 7 rests respectively on one of the conductor tracks 14b of the circuit board 14. The circuit board 14 is arranged compressed in the direction of the power semiconductor switches 5 and 6 in such a way that the respective second contact device 7b of the first contact springs 7 forms an electrically conducting pressure contact with the conductor track 14b of the circuit board 14 on which it rests, and the first contact devices 7a of the first contact springs 7 form an electrically conducting pressure contact with the control terminals 5c and 6c of the power semiconductor switches 5 and 6. In addition, if present, the second contact springs 8 are arranged between the circuit board 14 and the second intermediate circuit rail 3. The respective second contact device 8b of the second contact springs 8 rests on one of the conductor tracks 14b of the circuit board 14. The circuit board 14 is arranged compressed in the direction of the power semiconductor switches 5 and 6 in such a way that the respective second contact device 8b of the second contact springs 8 forms an electrically conducting pressure contact with the conductor track 14b of the circuit board 14 on which it rests, and the first contact devices 8a of the second contact springs 8 form an electrically conducting pressure contact with the auxiliary terminals 5d and 6d of the power semiconductor switches 5 and 6. The power semiconductor device 15 preferably has a pressure device 16 which presses the circuit board 14 with a force F in the direction of the power semiconductor switches 5 and 6. For this purpose the pressure device 16 can be screwed, e.g. by means of a screw connection not shown in the figures, to one of the intermediate circuit rails 2 and 3, to the AC potential rail 4, or to any other element. To activate the power semiconductor switches 5 and 6, e.g. a control circuit, not shown in FIG. 3, can be arranged on the circuit board 14. It should be noted that, instead of the contact springs 7 or 8, the power semiconductor module 1 can also have cables which are electrically conductively connected to the control terminals 5c and 6c of the power semiconductor switches 5 and 6 and, if present, to the auxiliary terminals 5d and 6d of the power semiconductor switches 5 and 6, by means of a solder joint, for example. The cables can be electrically conductively connected to the conductor tracks 14b of the circuit board 14, e.g. by means of a solder connection.

Of course, unless inherently excluded, the features mentioned in the singular may also be present multiple times in the power semiconductor module according to the invention.

It should be noted at this point that features of different exemplary embodiments of the invention, provided the said features are not mutually exclusive, can of course be freely combined without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor module, comprising:
   an electrically conducting first intermediate circuit rail for carrying a first DC voltage potential;
   an electrically conducting second intermediate circuit rail for carrying a second DC voltage potential;
   electrically conducting AC potential rail for carrying an AC voltage potential;
   a packaged first and second power semiconductor switch, wherein the respective power semiconductor switch has a first main side and a second main side opposite the first main side;
   a first load current terminal of the respective power semiconductor switch is arranged on the first main side and a second load current terminal of the respective power semiconductor switch;
   a control terminal of the respective power semiconductor switch is arranged on the second main side;
   the first power semiconductor switch is arranged between the first intermediate circuit rail and the AC potential rail;
   the second power semiconductor switch is arranged between the second intermediate circuit rail and the AC potential rail;
   the first load terminal of the first power semiconductor switch is electrically conductively contacted to the first intermediate circuit rail and the second load terminal of the first power semiconductor switch is electrically conductively contacted to the AC potential rail;
   the first load terminal of the second power semiconductor switch is electrically conductively contacted to the AC potential rail and the second load terminal of the second power semiconductor switch is electrically conductively contacted to the second intermediate circuit rail;
   the control terminal of the first power semiconductor switch is arranged projecting from the AC potential rail in the direction perpendicular to the normal direction (N) of the AC potential rail;
   the second intermediate circuit rail has a first through opening aligned flush with the control terminal of the first power semiconductor switch in the normal direction (N) of the AC potential rail, and a second through opening is aligned flush with the control terminal of the second power semiconductor switch in the normal direction (N) of the AC potential rail.

2. The power semiconductor module, according to claim 1, wherein:
   the control terminal of the second power semiconductor switch is arranged projecting from the AC potential rail in the direction perpendicular to the normal direction (N) of the AC potential rail, and in the opposite direction to the control terminal of the first power semiconductor switch.

3. The power semiconductor module, according claim 2, wherein:
   the power semiconductor module has a plurality of electrically conducting first contact springs, which each have a first and a second contact device and an elastic spring section arranged between the first and second contact device, wherein a section of a respective first contact spring extends through the first or second through opening, the first contact device of the respective first contact spring resting on a control terminal of the respective power semiconductor switch.

4. The power semiconductor module, according to claim 3, wherein:
   on the second main side an auxiliary terminal of the respective power semiconductor switch is arranged, which is electrically conductively connected to the first load current connector of the respective power semiconductor switch; and
   wherein the auxiliary terminal of the first power semiconductor switch is arranged projecting from the AC potential rail in the direction perpendicular to the normal direction (N) of the AC potential rail, wherein the second intermediate circuit rail has a third through opening aligned flush with the control terminal of the first power semiconductor switch in the normal direction (N) of the AC potential rail and a fourth through opening aligned flush with the control terminal of the second power semiconductor switch in the normal direction (N) of the AC potential rail.

5. The power semiconductor module, according to claim 4, wherein:
the auxiliary terminal of the second power semiconductor switch is arranged projecting from the AC potential rail in the direction perpendicular to the normal direction (N) of the AC potential rail, and in the opposite direction to the auxiliary terminal of the first power semiconductor switch.

6. The power semiconductor module, according to claim 5, wherein:
the first and third through opening are connected to each other so that they form a first overall opening and/or that the second and fourth through opening are connected to each other so that they form a second overall opening.

7. The power semiconductor module, according to claim 6, wherein:
the power semiconductor module has electrically conducting second contact springs, which each have a first and a second contact device and an elastic spring section arranged between the first and second contact device; and
wherein a section of a respective second contact spring extends through the third or fourth through opening, the first contact device of the respective second contact spring resting on a control terminal of the respective power semiconductor switch.

8. The power semiconductor module, according to claim 6, wherein:
the power semiconductor module has a first capacitor arranged between the first and second intermediate circuit rail; and
wherein an electrical first terminal of the first capacitor is electrically conductively connected to the first intermediate circuit rail and an electrical second terminal of the first capacitor is electrically conductively connected to the second intermediate circuit rail.

9. The power semiconductor module, according to claim 6, wherein:
the power semiconductor module has a second capacitor which is not arranged between the first and second intermediate circuit rail; and
wherein an electrical first terminal of the second capacitor is electrically conductively connected to the first intermediate circuit rail and an electrical second terminal of the second capacitor is electrically conductively connected to the second intermediate circuit rail.

10. The power semiconductor module, according to claim 6, wherein:
the respective load current terminal is electrically conductively contacted to the respective intermediate circuit rail or to the AC potential rail, in each case via a metal layer consisting of an aluminium-nickel metal composite.

11. The power semiconductor module, according to claim 10, wherein:
the respective metal layer consists of an aluminum-nickel metal composite generated as a result of an exothermic thermal reaction of a stack of alternating aluminum and nickel layers arranged on top of one another, which have a thickness in the nanometer range.

12. A power semiconductor device, having a power semiconductor module according to claim 3, further comprising:
a circuit board, which on a main side thereof facing the second intermediate circuit rail has conductor tracks;
the first contact springs are arranged between the circuit board and the second intermediate circuit rail;
the respective second contact device of the first contact springs rests in each case on one of the conductor tracks of the circuit board;
the circuit board is arranged compressed in the direction of the power semiconductor switches in such a way that the respective second contact device of the first contact springs forms an electrically conducting pressure contact with the conductor track of the circuit board on which it rests; and
the first contact devices of the first contact springs form an electrically conducting pressure contact with the control terminals of the power semiconductor switches.

13. The power semiconductor device, according to claim 12, further comprising:
a plurality of second contact springs according to claim 7, are arranged between the circuit board and the second intermediate circuit rail;
the respective second contact device of the second contact springs rests on one of the conductor tracks of the circuit board;
the circuit board is arranged compressed in the direction of the power semiconductor switches in such a way that the respective second contact device of the second contact springs form an electrically conducting pressure contact with the conductor track of the circuit board on which it rests; and
the first contact devices of the second contact springs form an electrically conducting pressure contact with the auxiliary terminals of the power semiconductor switches.

* * * * *